United States Patent
Amalfi et al.

(10) Patent No.: US 12,324,131 B2
(45) Date of Patent: Jun. 3, 2025

(54) MANIFOLD SYSTEMS, DEVICES, AND METHODS FOR THERMAL MANAGEMENT OF HARDWARE COMPONENTS

(71) Applicant: Seguente, Inc., Melbourne, FL (US)

(72) Inventors: Raffaele Luca Amalfi, Melbourne, FL (US); Ryan Enright, Berkeley Heights, NJ (US); John Kim, Bridgewater, NJ (US)

(73) Assignee: Seguente, Inc., Melbourne, FL (US)

( * ) Notice: Subject to any disclaimer, the term of this patent is extended or adjusted under 35 U.S.C. 154(b) by 188 days.

(21) Appl. No.: 18/198,522

(22) Filed: May 17, 2023

(65) Prior Publication Data

US 2023/0380114 A1     Nov. 23, 2023

Related U.S. Application Data

(60) Provisional application No. 63/344,291, filed on May 20, 2022.

(51) Int. Cl.
*H05K 7/20* (2006.01)

(52) U.S. Cl.
CPC ..... *H05K 7/20818* (2013.01); *H05K 7/20309* (2013.01); *H05K 7/20318* (2013.01); *H05K 7/20327* (2013.01)

(58) Field of Classification Search
CPC .......... H05K 7/20818; H05K 7/20309; H05K 7/20318; H05K 7/20327
USPC ................................................... 361/679.54
See application file for complete search history.

(56) References Cited

U.S. PATENT DOCUMENTS

| | | |
|---|---|---|
| 4,835,522 A | 5/1989 | Andrejasich |
| 5,953,930 A | 9/1999 | Chu |
| 6,536,510 B2 | 3/2003 | Khrustalev |
| 6,741,469 B1 | 5/2004 | Monfarad |
| 6,772,598 B1 | 8/2004 | Rinehart |
| 6,958,911 B2 | 10/2005 | Cader |
| 8,000,938 B2 | 8/2011 | McConnell |
| 8,297,069 B2 | 10/2012 | Novotny |
| 8,706,308 B2 | 4/2014 | Reichmuth |
| 9,552,025 B2 | 1/2017 | Samadiani |
| 9,668,382 B2 | 5/2017 | Steinke |
| 9,958,911 B2 | 5/2018 | Alvarado |
| 10,328,408 B2 | 6/2019 | Victor |

(Continued)

FOREIGN PATENT DOCUMENTS

| | | |
|---|---|---|
| CN | 102496209 A | 6/2012 |
| DE | 2057345 A1 | 6/1972 |

(Continued)

OTHER PUBLICATIONS

Swiss Re Institute, News release, World economy set to lose up to 18% GDP from climate change if no action taken, reveals Swiss Re Institute's stress-test analysis, Apr. 2021, 4 pages.

(Continued)

*Primary Examiner* — Zhengfu J Feng
(74) *Attorney, Agent, or Firm* — Brian S. Steinberger; Hilary F. Steinberger; Steinberger IP Law

(57) ABSTRACT

Systems, devices and methods for providing cooling to hardware components, and more specifically to manifold systems, devices and methods for thermal management of hardware in computer server racks and related equipment in computer data centers.

15 Claims, 15 Drawing Sheets

(Schematic of the two-phase cooling system.)

(56) References Cited

U.S. PATENT DOCUMENTS

| | | | |
|---|---|---|---|
| 10,448,543 | B2 | 10/2019 | Farshchian |
| 10,581,974 | B2 | 3/2020 | Sustaeta |
| 10,643,121 | B2 | 5/2020 | Evans |
| 10,912,229 | B1 * | 2/2021 | Gao .................. H05K 7/20818 |
| 11,871,547 | B2 * | 1/2024 | Gao .................. H05K 7/20809 |
| 2005/0120737 | A1 | 6/2005 | Borror |
| 2007/0201204 | A1 | 8/2007 | Upadhya |
| 2007/0227707 | A1 | 10/2007 | Machiroutu |
| 2008/0236795 | A1 | 10/2008 | You |
| 2010/0012294 | A1 | 1/2010 | Bezama |
| 2013/0027884 | A1 | 1/2013 | Campbell |
| 2014/0007597 | A1 | 1/2014 | Harvey |
| 2016/0120058 | A1 * | 4/2016 | Shedd .................. F28F 3/12 165/244 |
| 2016/0128238 | A1 | 5/2016 | Shedd |
| 2016/0330873 | A1 * | 11/2016 | Farshchian ........ H05K 7/20663 |
| 2016/0381834 | A1 * | 12/2016 | Harvilchuck ......... F28F 9/0075 285/91 |
| 2017/0049009 | A1 | 2/2017 | Steinke |
| 2017/0068258 | A1 | 3/2017 | Lyon |
| 2017/0314871 | A1 | 11/2017 | Basu |
| 2019/0141861 | A1 | 5/2019 | Shedd |
| 2020/0106297 | A1 | 4/2020 | Ross |
| 2021/0084796 | A1 * | 3/2021 | Gao .................. H05K 7/20818 |
| 2021/0148608 | A1 * | 5/2021 | Gao ...................... F24F 5/0035 |
| 2021/0219463 | A1 | 7/2021 | Raman |
| 2022/0113219 | A1 | 4/2022 | Stumpf |
| 2022/0154983 | A1 | 5/2022 | Bouquet |
| 2022/0196343 | A1 | 6/2022 | Lawless |
| 2022/0217872 | A1 | 7/2022 | Heydari |
| 2022/0338387 | A1 * | 10/2022 | Enright .............. H05K 7/20727 |
| 2022/0369510 | A1 | 11/2022 | Heydari |
| 2022/0418167 | A1 * | 12/2022 | Gao .................. H05K 7/20781 |
| 2023/0022410 | A1 | 1/2023 | Liu |
| 2023/0147728 | A1 | 5/2023 | Archibald |
| 2023/0247795 | A1 | 8/2023 | Khalili |
| 2023/0273597 | A1 | 8/2023 | Guim Bernat |

FOREIGN PATENT DOCUMENTS

| | | |
|---|---|---|
| EP | 3324716 A2 | 5/2018 |
| SE | 507934 C2 | 7/1998 |
| WO | 2022037991 A1 | 2/2022 |
| WO | 2023121701 A1 | 6/2023 |

OTHER PUBLICATIONS

McKinsey&Company, The Internet of Things: How to capture the value of IoT, May 2018, 124 pages.

Liu, Qiang et al., Green data center with IoT sensing and cloud-assisted smart temperature controlling system, Elsevier B.V., Computer Networks, Dec. 5, 2015, vol. 101, 11 pages.

Building Energy Efficiency Standards—Title 24, retrieved on Jun. 8, 2023, https://www.energy.ca.gov/programs-and-topics/programs/building-energy-efficiency-standards, 6 pages.

Seguente, Inc., PCT Patent Application No. PCT/US23/25436, filed Jun. 15, 2023, Notification of the Transmittal of the International Search Report and the Written Opinion of the International Searching Authority, or the Declaration, mailed Sep. 20, 2023, 15 pages.

Seguente, Inc., PCT Patent Application No. PCT/US23/22547, filed May 17, 2023, Notification of the Transmittal of the International Search Report and the Written Opinion of the International Searching Authority, or the Declaration, mailed Sep. 27, 2023, 18 pages.

Szczukiewicz, Sylwia et al., Passive Thermosyphon Cooling System for High Heat Flux Servers, Proceedings of the ASME 2015 International Technical Conference and Exhibition on Packaging and Integration of Electronic Photonic Microsystems, 2015, 12 pages.

Amalfi, Raffaele L. et al., An Optimization Algorithm to Design Compact PLate Heat Exchangers for Waste Heat Recovery Applications in High Power Datacenter Racks, 18th IEEE Itherm Conference, 2019, 8 pages.

Amalfi, Raffaele L. et al., Design of Passive Two-Phase Thermosyphons for Server Cooling, Proceedings of the ASME 2019 International Technical Conference and Exhibition on Packaging and Integration of Eelectronic and Photonic Microsystems, 2019, 13 pages.

Data center green cooling solution—alcatel-lucent & bell labs, ECA Cool, https://www.ecacool.com/en/videos/data_center_green_cooling/, retrieved on May 5, 2023, 1 page.

Lamaison, Nicolas et al., Two-Phase Mini-Thermosyphon Electronics Cooling, Part 4: Application to 2U Servers, 15th IEEE ITHERM Conference, 2016, 11 pages.

Nadjahi, Chayan et al., Experimental study and analytical modeling of thermosyphon loop for cooling data center racks, Heat and Mass Transfer, Springer Nature 2019, 22 pages.

Seguente, Inc., PCT/US2024/055479, filed Nov. 12, 2024, Notification of Transmittal of the International Search Report and the Written Opinion of the International Searching Authority, or the Declaration, mailed Jan. 17, 2025, 19 pages.

Seguente, Inc., PCT/US2024/057683, filed Nov. 27, 2024, Notification of Transmittal of the International Search Report and the Written Opinion of the International Searching Authority, or the Declaration, mailed Feb. 6, 2025, 15 pages.

Seguente, Inc., PCT/US2024/045540, filed Sep. 6, 2024, Notification of Transmittal of the International Search Report and the Written Opinion of the International Searching Authority, or the Declaration, mailed Dec. 30, 2024, 25 pages.

* cited by examiner (Schematic of the two-phase cooling system.)

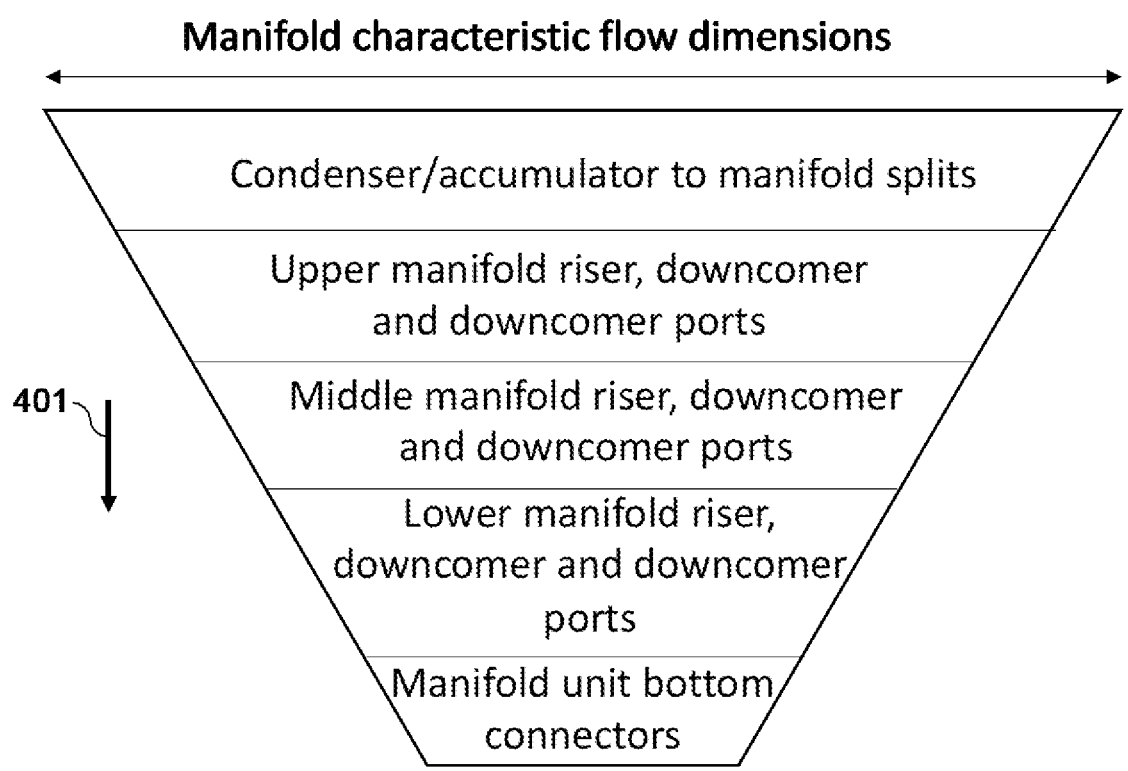
FIG. 4 (Representation of the manifold unit 307 characteristic flow dimensions)

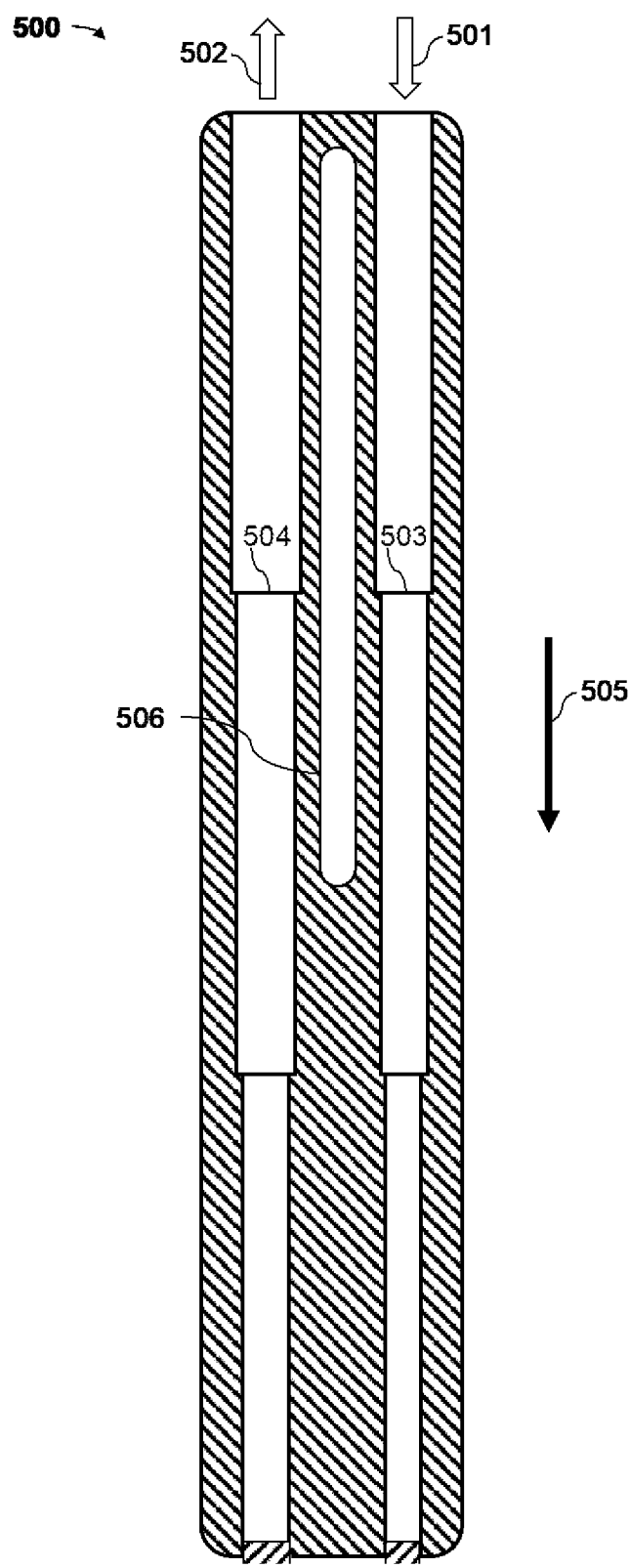
FIG. 5. (Schematic cross-section of manifold unit 307 implementation showing decreasing flow cross sectional area with decreasing elevation in the downcomer and riser and the introduction of an air gap feature to manage the flow of heat between the riser and downcomer).

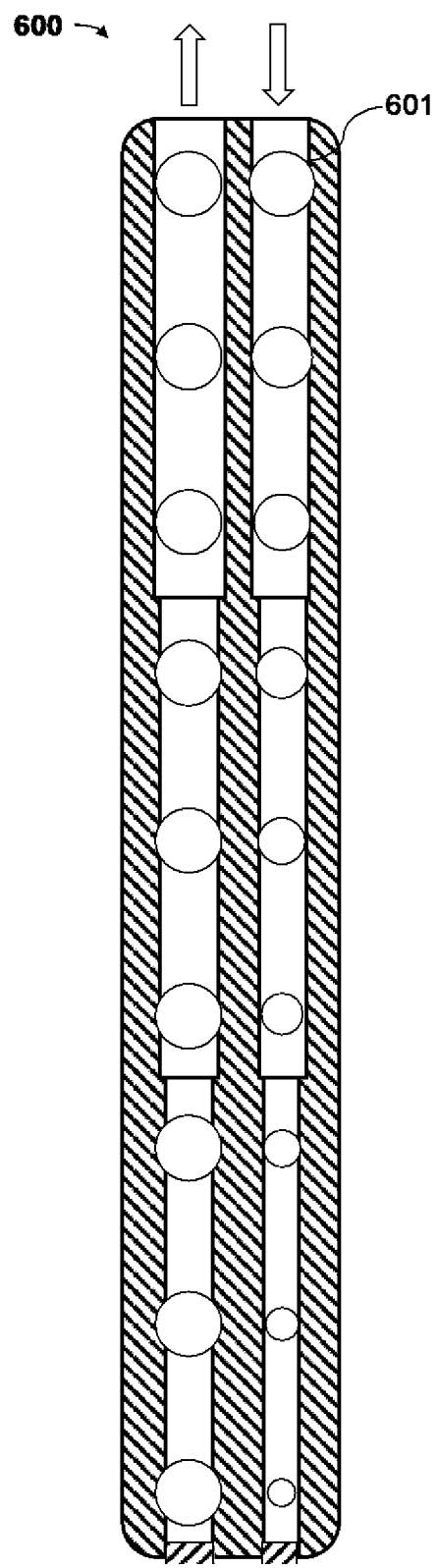
FIG 6. (Schematic cross-section of manifold (riser/downcomer)

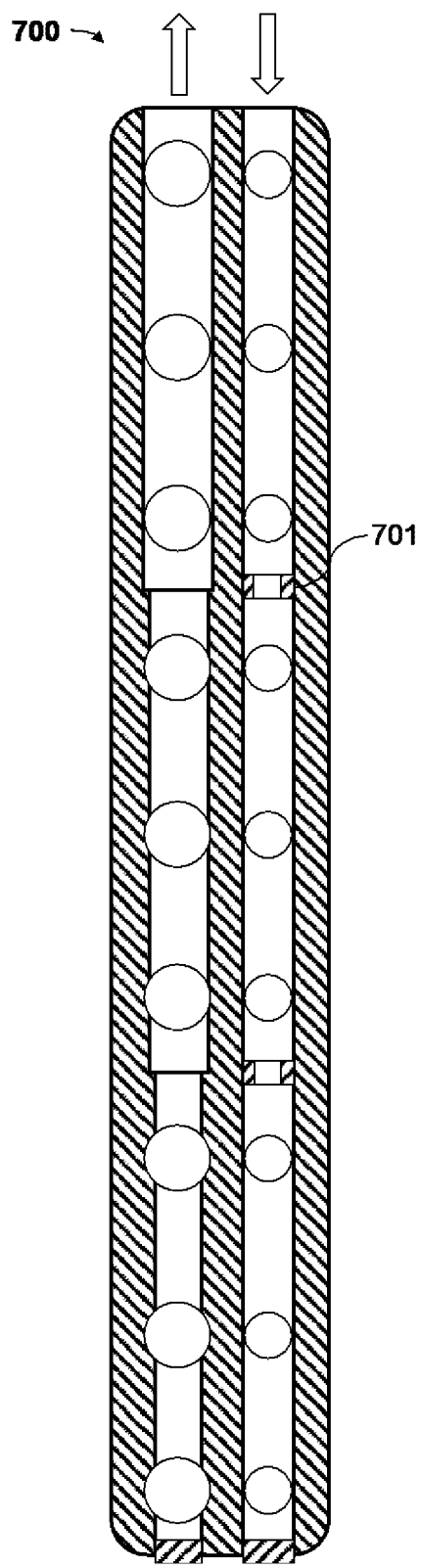
FIG 7. (Schematic cross-section of manifold (riser/downcomer) showing restrictions placed in the downcomer that manages flow distribution due to the increasing static head of the liquid in the downcomer).

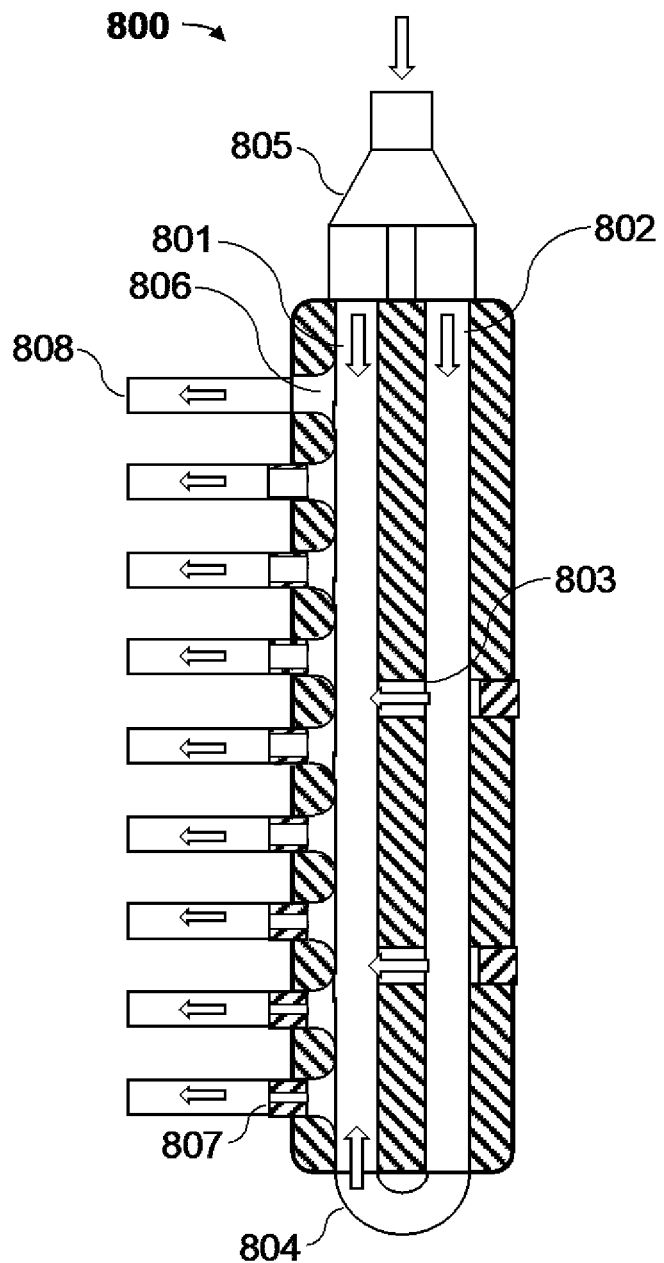
FIG.8A. (Schematic cross-section of a manifold showing a primary downcomer, a by-pass downcomer and the fluidic connectivity between the two).

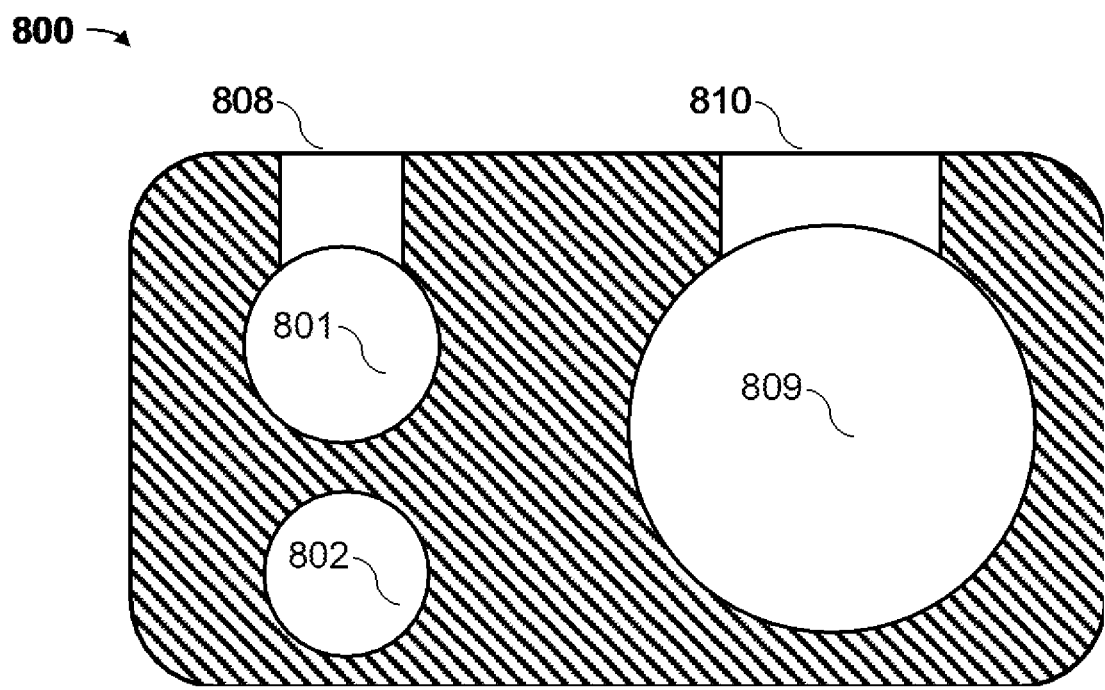
FIG. 8B (Cross-section schematic of a manifold in FIG. 9A showing the riser, primary downcomer and by-pass downcomer)

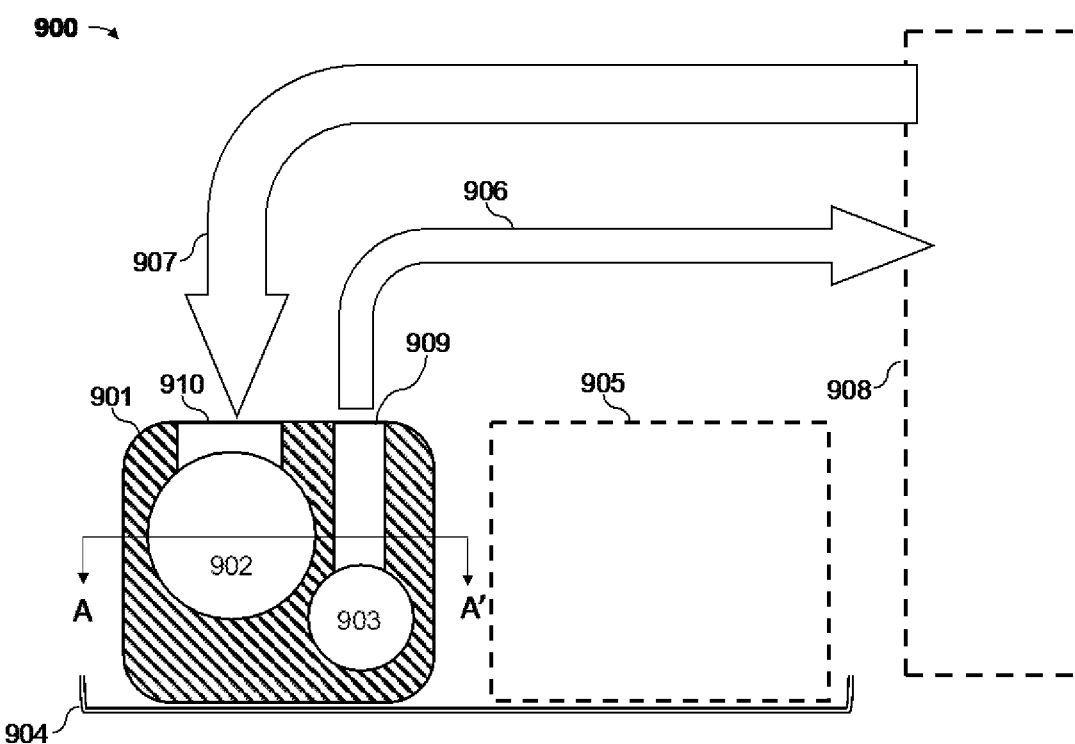
FIG. 9A. (Cross-section schematic of a manifold (view B-B' in FIG. 10B showing an asymmetric riser and downcomer configured in an offset fashion to minimize the width of the manifold when mounted on a rail to facilitate the placement of additional coolant or power distribution components or cable management.)

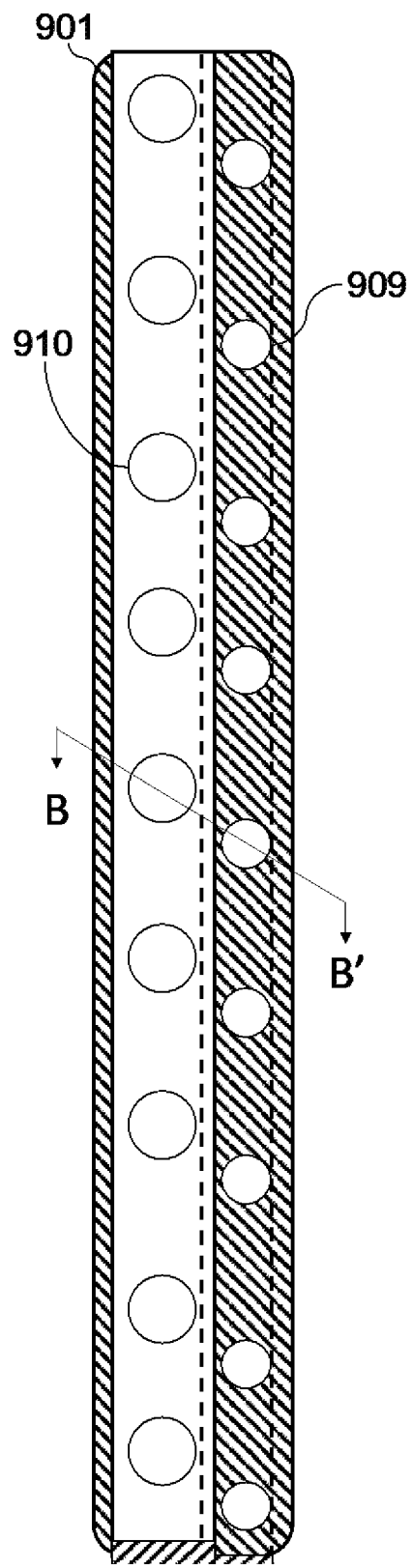
FIG. 9B (Cross-section schematic (A-A' view in FIG. 10A) of a manifold showing the vertically offset riser and downcomer ports to facilitate compact width of the manifold.)

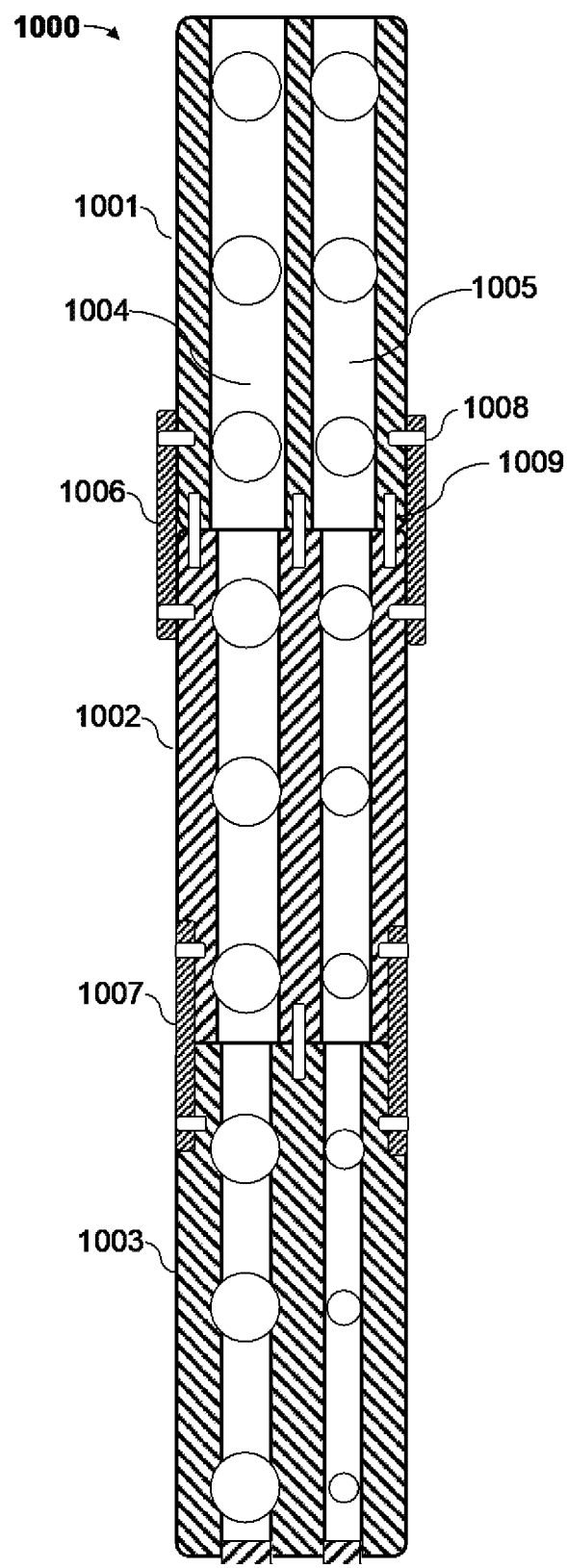
FIG. 10. (Cross-section schematic of a modular multi-section manifold showing a combination of manifold sections with differing flow dimensions.)

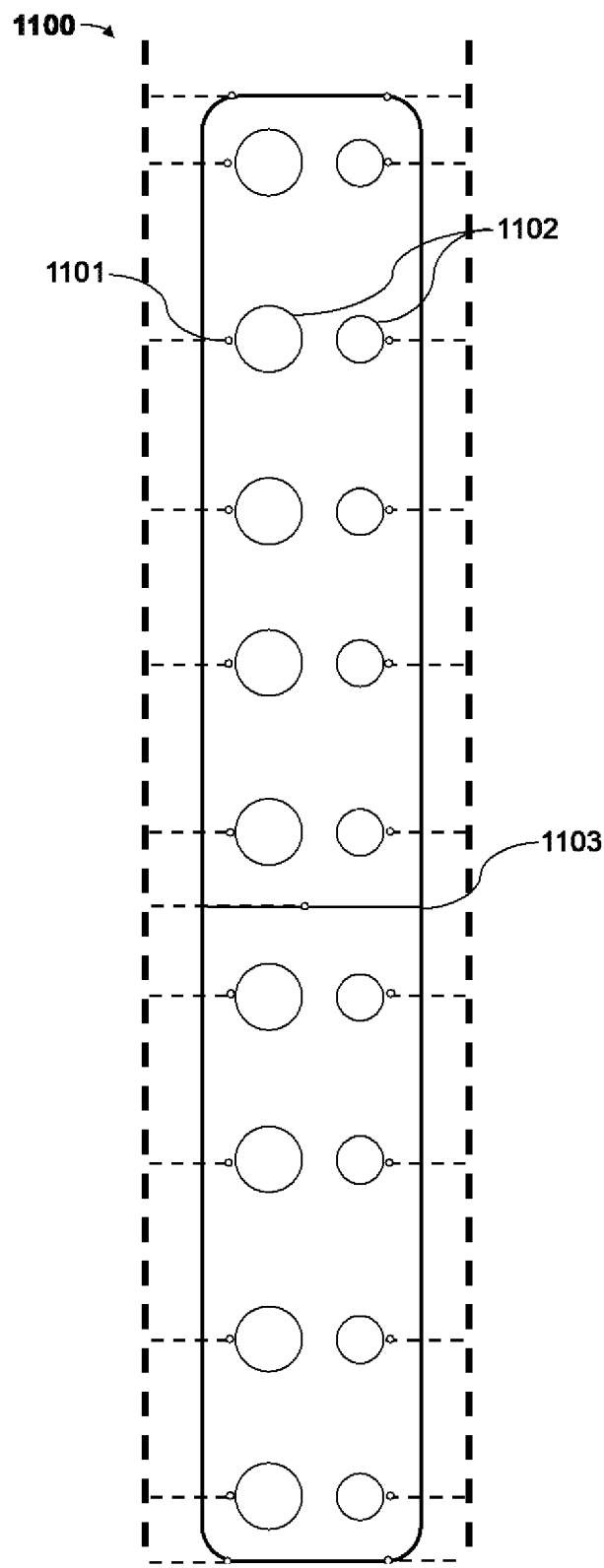
FIG. 11. (Temperature-sensor-network-based leak detection with probes located at potential weak points in the system including threaded fittings and at the joint between manifold sections in a modular deployment.)

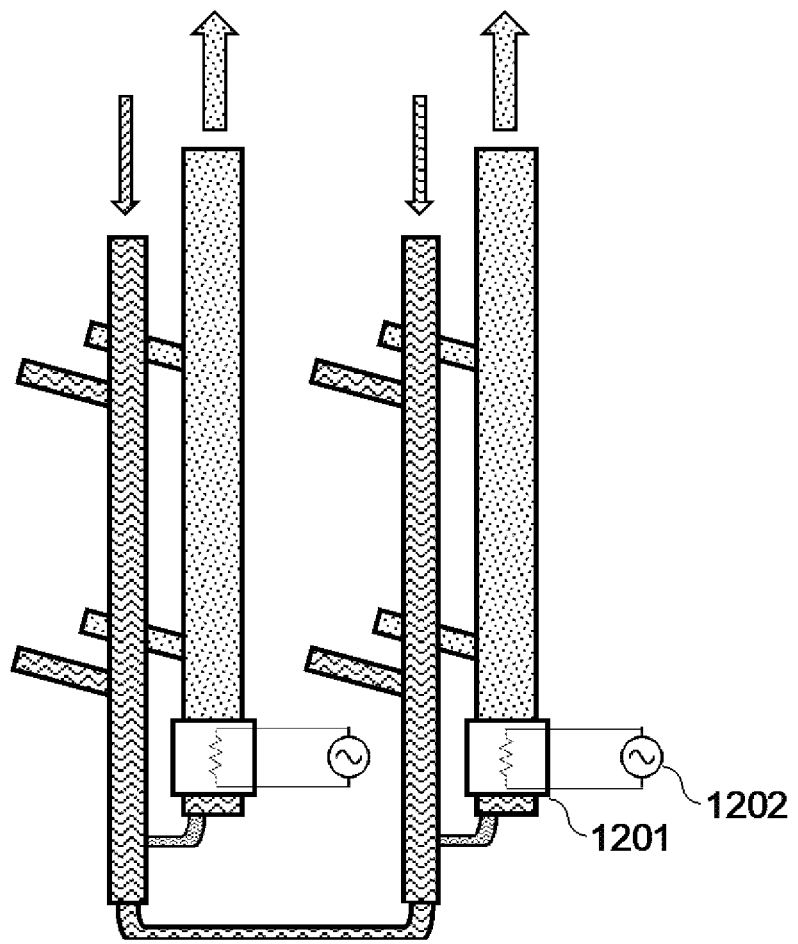
FIG. 12. (Schematic of a specific implementation where the control heaters are attached on the bottom of the manifold risers below the level of the bottommost server working fluid connections.)

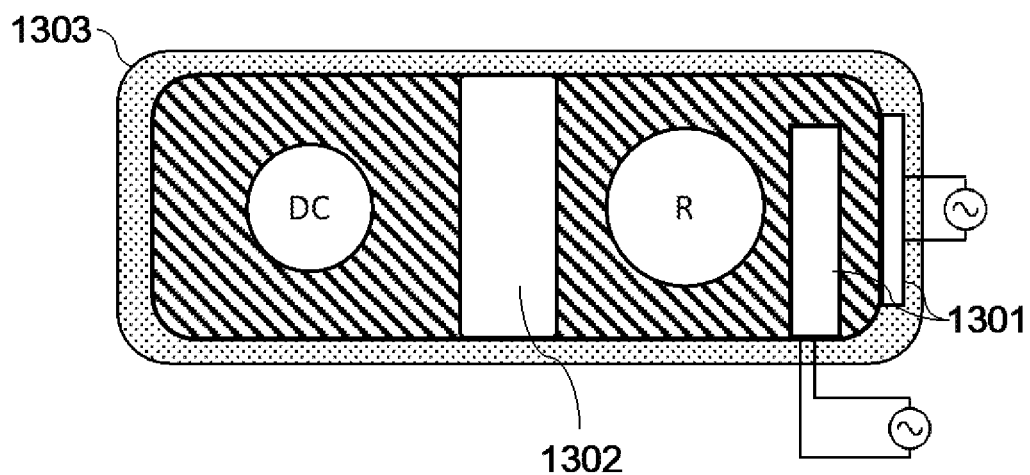
FIG 13. Schematic of a specific implementation where the control heaters are attached on the bottom of the manifold risers below the level of the bottommost server working fluid connections.

MANIFOLD SYSTEMS, DEVICES, AND METHODS FOR THERMAL MANAGEMENT OF HARDWARE COMPONENTS

CROSS REFERENCE TO RELATED APPLICATIONS

This application claims the benefit of priority to U.S. Provisional Application Ser. No. 63/344,291 filed May 20, 2022, the entire which is incorporated herein by specific reference thereto.

FIELD OF INVENTION

This invention relates to systems, devices and methods for providing cooling to hardware components, and more specifically to manifold systems, devices and methods for thermos management of thermosyphon hardware in computer server racks and related equipment in computer data centers.

BACKGROUND AND PRIOR ART

The seismic shift towards digitization across virtually all industries is resulting in urgent mandates to develop next-generation information and communication technologies (ICT) to address transmission, orchestration, storage, and processing of evermore increasing volume of data. It is widely expected that, due to the higher power dissipation of new generations of hardware components, e.g., CPUs and GPUs, traditional air-based thermal management solutions will face significant challenges. Specifically, air-cooling technologies will likely reach physical limits for power dissipation in prevailing hardware form factors and their decreasing energy efficiency is a growing concern for operators.

The majority of data centers and telecom installations are designed and still operate with air-cooling technologies, and their energy consumption to cool hardware equipment is on average approximately 40% of the total energy consumption.

With growing awareness of social responsibility to combat climate change, there is a global consensus for action to improve energy efficiency and reduce carbon emissions across all industry. Hence, it is extremely important the development of a novel high-efficiency cooling technology, which will meet these requirements and can be widely adopted. Two-phase cooling technologies provide excellent key metrics, e.g., heat density, efficiency, reliability, etc., and represent a viable, long-term solution with regards to hardware densifications and thermal performance required by next-generation telecommunications and computing platforms. This invention disclosure details a flow distribution architecture to ensure optimal operation of two-phase cooling technologies overcoming flow instabilities, flow maldistribution and facilitates maximum IT hardware availability.

FIG. 1 shows a basic prior art schematic of a two-phase cooling system with its main components; evaporator, two-phase flow conduit (riser), condenser and single-phase flow conduit (downcomer). Heat removed from the heat source is represented by the arrows, labelled H1, while heat rejected to the secondary side coolant is represented by the arrows labelled G1. Such cooling systems can be actively pumped or leverage passive mechanism such as gravity/buoyancy and/or capillarity to drive flow circulation.

In a passive implementation leveraging gravity, the liquid refrigerant enters the evaporator and is boiled to remove the heat from the electronics. The resulting two-phase mixture is guided upwards to the condenser by the riser due to the development of a buoyancy force dictated by the relative difference of the fluid density on the downcomer and riser. Here, the two-phase mixture is converted back to, or mostly back to, liquid within an air, single-phase liquid or two-phase liquid-cooled condenser, dissipating the heat to the facility side. Then, the liquid refrigerant is guided downwards to the evaporator by the gravity force to start the loop again.

For this system the driving force is proportional to the total height of the system and to the density difference between the liquid refrigerant in the downcomer and the two-phase mixture in the riser. To have passive flow circulation the driving force (also called gravitational pressure gain) needs to be higher than the total pressure drop in the loop (considering evaporator, riser and condenser).

For proper operation, such a system must be designed with the evaporator located below the condenser, and thus must be implemented vertically. Same components can be used for an active two-phase cooling system where the driving force, instead of being represented by the gravitational pressure gain, is provided by the pump static head. In this implementation, the cooling system can be implemented in both horizontal and vertical orientations.

FIG. 2 shows a prior art concept of a two-phase cooling technology for next generation server racks. The schematic in FIG. 2 assumes that the servers are vertically oriented inside the rack).

See Szczukiewicz, S., Lamaison, N., Marcinichen, J. B., Thome, J. R., & Beucher, P. J. (2015). Passive Thermosyphon Cooling System for High Heat Flux Servers. Volume 3: Advanced Fabrication and Manufacturing; Emerging Technology Frontiers; Energy, Health and Water—Applications of Nano-, Micro- and Mini-Scale Devices; MEMS and NEMS; Technology Update Talks; Thermal Management Using Micro Channels, Jets, Sprays. doi:10.1115/ipack2015-48288; R. L. Amalfi, F. Cataldo, J. R. Thome, An optimization algorithm to design compact plate heat exchangers for waste heat recovery applications in high power data canter racks, Intersociety Conference on Thermal and Thermomechanical Phenomena in Electronic Systems, ITHERM 2019, Florida, USA and R. L. Amalfi, J. B. Marcinichen, J. R. Thome, F. Cataldo, Design of passive two-phase thermosyphons for server cooling, International technical conference and exhibition on packaging and integration of electronic and photonic microsystems, InterPACK 2019, California, USA.

U.S. Pat. No. 5,953,930 to Chu et al., which is incorporated by reference, disclose a thermosyphon cooling system with an overhead air-cooled condenser and vertical evaporator attached to the heat generating components. Each evaporator is matched to a dedicated air-cooled condenser. They describe the sizing of the liquid and vapor lines and a tapered design of the flow distribution header inside the evaporator structure.

U.S. Pat. No. 6,536,510 to Khrustalev et al., which is incorporated by reference, disclose a loop thermosyphon cooling system for electronics where a single condenser is coupled to a plurality of evaporators. In the overall system, multiple condensers are deployed and each fluidically couples to a plurality of evaporators substantially at the same elevation. Wick structures are implemented in the evaporator sections to leverage capillary forces.

Lamaison et al. disclosed a cascaded thermosyphon cooling loop where multiple rack-scale risers and downcomers are fluidically coupled to a single overhead rack-scale condenser and to multiple evaporators thermally coupled to condensers of secondary thermosyphon loops positioned inside vertical server form factors distributed vertically in a rack architecture. See (http://www.nanotera.ch/pdf/posters2014/YINS294.pdf).

U.S. Pat. No. 10,448,543 to Farschchian et al, which is incorporated by reference, discloses a passive two-phase implementation for cooling data centers. This can be seen as a variation of the technology with a common rack-level thermosyphon having two thermal bus lines (riser and downcomer) for the connection with a single overhead air- or liquid-cooled condenser for horizontally disposed heat generating components.

The '543 Farschchian et al, patent also discloses an implementation whereby the heat generating components are oriented vertically and mechanically interfaced to multiple risers fed from a common downcomer fed from a common condenser. They disclose the use of isolating fluid disconnects between the fluid headers and evaporator assemblies that incorporate an orifice to meter the flow to the evaporators. This is orifice is described as fixed or adjustable based on the dynamically-varying amount of heat dissipated from one or more heat generating components.

U.S. Pat. No. 9,552,025 to Samadiani et al., which is incorporated by reference, proposed a two-phase system for server-level cooling. The cooling system is a low-height thermosyphon that has a liquid-cooled condenser located on the back of the server. The invention describes active control of a mechanical actuator to regulate the liquid level in the evaporator as a function of the hardware component power dissipation.

Lamaison et al. introduced a new mini-thermosyphon design for 2-U servers. The evaporators are used to cool two heat generating components, such as CPUs or GPUs, and there is a common condenser located towards the back of the rack that is cooled by chilled water.

See N. Lamaison, J. B. Marcinichen, C. L. Ong, J. R. Thome, Two-phase mini-thermosyphon electronics cooling, Part 4: application to 2-U servers, Intersociety Conference on Thermal and Thermomechanical Phenomena in Electronic Systems, ITHERM 2016, Las Vegas, NV, USA.

The Lamaison et al. system is stated to be compatible with hot-swappable servers, even though the mechanism is not presented. In the main downcomer tube (at the outlet of the condenser), the authors included a liquid accumulator to optimize thermosyphon thermal-hydraulic performance over a wide range of heat loads and heat rejection temperatures. The entire design including the evaporators, condenser, riser and downcomer tubes is made from copper. The evaporators and condenser can be designed with micro-scale structures, for example micro-channels, to enhance condensation and boiling heat transfer characteristics.

Nadjahi et al. presented experimental results for a thermosyphon-cooled rack deploying blade (vertical) servers. Air from the whitespace (indoor test room) is pulled into the rack using fans to cool the blade server components with a portion of the heat removed from the air flow by two standard evaporator coils that connect to a remote condenser located outside the whitespace. The servers were simulated by dummy heat sources. From a thermal perspective, the Nadjahi et al. implementation is similar to a typical rear-door cooled implementation where instead of the air-to-liquid heat exchanger located at the rear of the rack, they are deployed horizontally above/below the array of servers inside the rack. As such, the thermal performance is limited.

See C. Nadjahi, H. Louahlia-Gualous, S. Le Masson, Experimental study and analytical modeling of thermosyphon loop for cooling data center racks, Heat and Mass Transfer, https://doi.org/10.1007/s00231-019-02695-x, 2019.

U.S. Pat. No. 10,912,229 to Gao, which is incorporated by reference, describes techniques for cooling high-power datacenters, mainly focused on multi-function heat exchangers. Their servers can incorporate air-, liquid- or hybrid-cooling with a manifold located at rack-level. The liquid flowing in the manifold is not in direct contact with the secondary side coolant. This patent introduced the concept of multi-function heat exchangers that incorporate fans to cool the hot air coming from the servers and a room-level pumped system is required for this implementation. The core of this invention is the design of multi-function heat exchangers to be able to manage liquid- and air-cooling simultaneously from high-power racks.

U.S. Published Patent Application: 2016/0128238 to Shedd et al. and U.S. Published Patent Application: 2019/0141861 to Shedd et al., which are both incorporated by reference presented a broad invention disclosing a pumped two-phase cooling system for servers and other hardware layouts including quick couplings and flexible tubes for hot-swappability. For rack cooling, a common manifold at the room-level distributes coolant to a row of racks from a central pumping station. Guidelines for evaporator orifice designs are provided and U.S. Published Patent Application: 2019/0141861 to Shedd et al., discloses the design of an evaporator with redundant flow paths.

U.S. Pat. No. 9,958,911 to Alvarado et al., which is incorporated by reference. disclose a low momentum loss manifold design for two-phase spray cooling of racks employing angular transitions between the manifold header and the manifold port to minimize flow turning loss. The angular branch port is defined monolithically in the manifold which introduces an angular offset of the port from the hardware component to be cooled.

The prior art does not disclose how to address many practical challenges to implementing fluid distribution in passive/active two-phase cooling solutions. These challenges include at least the following:

Effectively transport the heat from the hardware components to the system-level heat exchanger.

Achieving high availability levels for the ICT system by providing redundancy of distribution paths Mitigating the effects of working fluid maldistribution due to the presence of static pressure variations present in vertically deployed two-phase cooling systems Sensors for monitoring the two-phase cooling system health Thermal control of the loop operation

SUMMARY OF THE INVENTION

A primary objective of the present invention is to provide systems, devices and methods for providing cooling to hardware components, and more specifically to manifold systems, devices and methods for thermal management of hardware relevant to the broad ICT industry A secondary objective of the present invention is to provide systems, devices and methods for providing cooling to hardware components, that effectively transport the heat from the hardware components to the system-level heat exchanger.

A third objective of the present invention is to provide systems, devices and methods for providing cooling to hardware components, that can mitigate the effects of working fluid maldistribution.

A fourth objective of the present invention is to provide systems, devices and methods for providing cooling to hardware components, that can minimize frictional pressure drops in the system while avoiding flow maldistribution.

A fifth objective of the present invention is to provide systems, devices and methods for providing cooling to hardware components, for sensing for monitoring, e.g., cooling fluid loss, and control of the loop operation, e.g., fluid distribution in those hardware components.

A sixth objective of the present invention is to provide systems, devices and methods for providing cooling to hardware components, for providing modular redundancy of distribution paths.

A preferred embodiment of a fluid flow manifold system for cooling a plurality of pluggable sub-systems selected from at least servers, network line cards, server sleds, server blades, optical pluggable modules, and other hardware equipment requiring thermal management used in the ICT (Information & Communication Technology) industry, comprises:

an overhead condenser that exchanges heat outside of the system with a flow line connection to an accumulator which manages fluid in a rack;

manifold units fluidly connected to the accumulator and the condenser, which include:

riser flow conduits and riser ports that convey two-phase fluid from the pluggable sub-systems to the condenser, downcomer flow conduits and downcomer ports which convey single-phase fluid to the pluggable sub-systems; and sloped branch junction connectors, wherein the manifold system distributes fluid flow due at an elevated pressure source to multiple manifold units that supply multiple evaporators in the plurality of the pluggable sub-systems in the system, and the pluggable sub-systems are cooled in parallel.

The elevated pressure source can be formed from gravity or a pump.

The manifold units can be fluidically connected to the accumulator and the condenser via sloped branch junctions to balance flow distribution via gravity on a downcomer side of the manifold system.

The manifold system can further include a minimal length between a condenser refrigerant inlet and the sloped branch junctions on a riser side to reduce pressure drop as two-phase flow returns to the condenser.

The manifold system can further include: redundant ports with isolation valves on the sloped branch junctions connecting to the downcomer and riser flow conduits in the manifold units to facilitate the replacement of manifold units during system operation.

The manifold system can further include: flow line connection between two or more downcomer lines at a lowest elevation of the system to balance downcomer liquid level; and server by-pass flow line with restricted flow CSA (cross section area) between a downcomer and riser at the lowest elevation of the system.

The manifold system can further include: progressive variation of flow tube CSA (cross section area) along a length of each manifold riser and downcomer.

The manifold system can further include: material selectively removed between a riser and downcomer manifold to achieve controlled heat conduction between the riser and downcomer manifold, while retaining structural integrity of the manifold system.

The manifold system can further include: flow restrictors inserted into the downcomer flow conduits and the downcomer ports of the manifold units to manage excess static pressure developed in the downcomer.

The manifold system can further include: smooth flow transition incorporated into the manifold units on entrances to the downcomer ports to guide passive fluid flow and on entrances to the riser ports to minimize pressure drop while maintaining riser and downcomer port alignment to the pluggable sub-systems.

The manifold system can further include: offset riser and downcomer flow conduits to optimize space occupied by the manifold units with ports sized substantially different to further manage space and minimize pressure drop.

Another embodiment of the manifold system for cooling a plurality of pluggable sub-systems in a system, can include: modular manifold unit components that provide flexibility to define different flow geometry parameters based on design distribution of heat sources and total size of the system to be cooled.

The manifold system can further include: a by-pass downcomer flow conduit to aid in the effective distribution of a coolant.

The manifold system can further include: coolant sensor modules installed on selected locations on the manifold system to detect leaks to provide real-time continuous anomaly detection.

The coolant sensor modules can be selected from at least one of: infrared-based sensors, electrochemical based sensors, MEMS (microelectromechanical systems) based sensors, and photodiode-based sensors.

The manifold system can further include: temperature probes strategically positioned around the system for coolant gross leak detection based on anomalous temperature variations, wherein the temperature probes are selected from at least one of: a thermocouple, thermistor, a RTD (resistance temperature device), and diode and are strategically positioned around the system at points of risk to mechanical failure, and therefore most probable refrigerant leak points.

The manifold system can further include: resistive heating elements on manifold risers to provide precise amounts of heat into a cooling loop for start-up control and during system operation.

The resistive heating elements can provide localized or distributed heat input into the cooling loop.

The manifold system can further include: an insulating layer on external surfaces of the manifold units.

An embodiment the fluid flow manifold system for cooling a plurality of pluggable sub-systems requiring thermal management for servers in computer centers, can include an overhead condenser that exchanges heat outside of the system with a flow line connection to an accumulator which manages fluid in a rack;

manifold units fluidly connected to the accumulator and the condenser; the manifold units include:

riser flow conduits and riser ports that convey two-phase fluid from the pluggable sub-systems to the condenser, downcomer flow conduits and downcomer ports to convey single-phase fluid to the pluggable sub-systems; and sloped branch junction connectors, wherein the manifold system distributes fluid flow due at an elevated pressure source to multiple manifold units that supply multiple evaporators in the plurality of the pluggable sub-systems in the system, and the pluggable sub-systems are cooled in parallel.

Further objects and advantages of this invention will be apparent from the following detailed description of the presently preferred embodiments which are illustrated schematically in the accompanying drawings.

BRIEF DESCRIPTION OF THE FIGURES

The drawing figures depict one or more implementations in accord with the present concepts, by way of example only, not by way of limitations. In the figures, like reference numerals refer to the same or similar elements.

FIG. 4 shows a representation of the manifold characteristic flow dimensions showing decreasing flow cross sectional area with decreasing elevation to manage changes in the static pressure of the liquid column in the downcomer and decreasing flowrate in the riser.

FIG. 5 shows a schematic cross-section of manifold unit 307 implementation showing decreasing flow cross sectional area with decreasing elevation in the downcomer and riser and the introduction of an air gap feature to manage the flow of heat between the riser and downcomer).

FIG. 6 shows a schematic cross-section of manifold (riser/downcomer).

FIG. 7 shows a schematic cross-section of manifold (riser/downcomer) showing progressive reduction in the downcomer port sizes that manages flow distribution due to the increasing static head of the liquid in the downcomer.

FIG. 8A shows a schematic cross-section of a manifold showing a primary downcomer, a by-pass downcomer, and the fluidic connectivity between the two.

FIG. 8B shows a cross-section schematic of a manifold of FIG. 9A showing the riser, primary downcomer and by-pass downcomer.

FIG. 9A shows a schematic cross-section of a manifold showing a primary downcomer, a by-pass downcomer and the fluidic connectivity between the two.

FIG. 9B shows a cross-section schematic of a manifold in FIG. 10A showing the riser, primary downcomer and by-pass downcomer.

FIG. 10 shows a cross-section schematic of a modular multi-section manifold showing a combination of manifold sections with differing flow dimensions.

FIG. 11 shows a temperature-sensor network based leak detection with probes located at potential weak points in the system.

FIG. 12 shows a schematic of a specific implementation where the control heaters are attached on the bottom of the manifold risers below the level of the bottommost server working fluid connections.

FIG. 13 shows a schematic of a specific implementation where the control heaters are attached on the bottom of the manifold risers below the level of the bottommost server working fluid connections.

DESCRIPTION OF THE PREFERRED EMBODIMENTS

Figure 1:
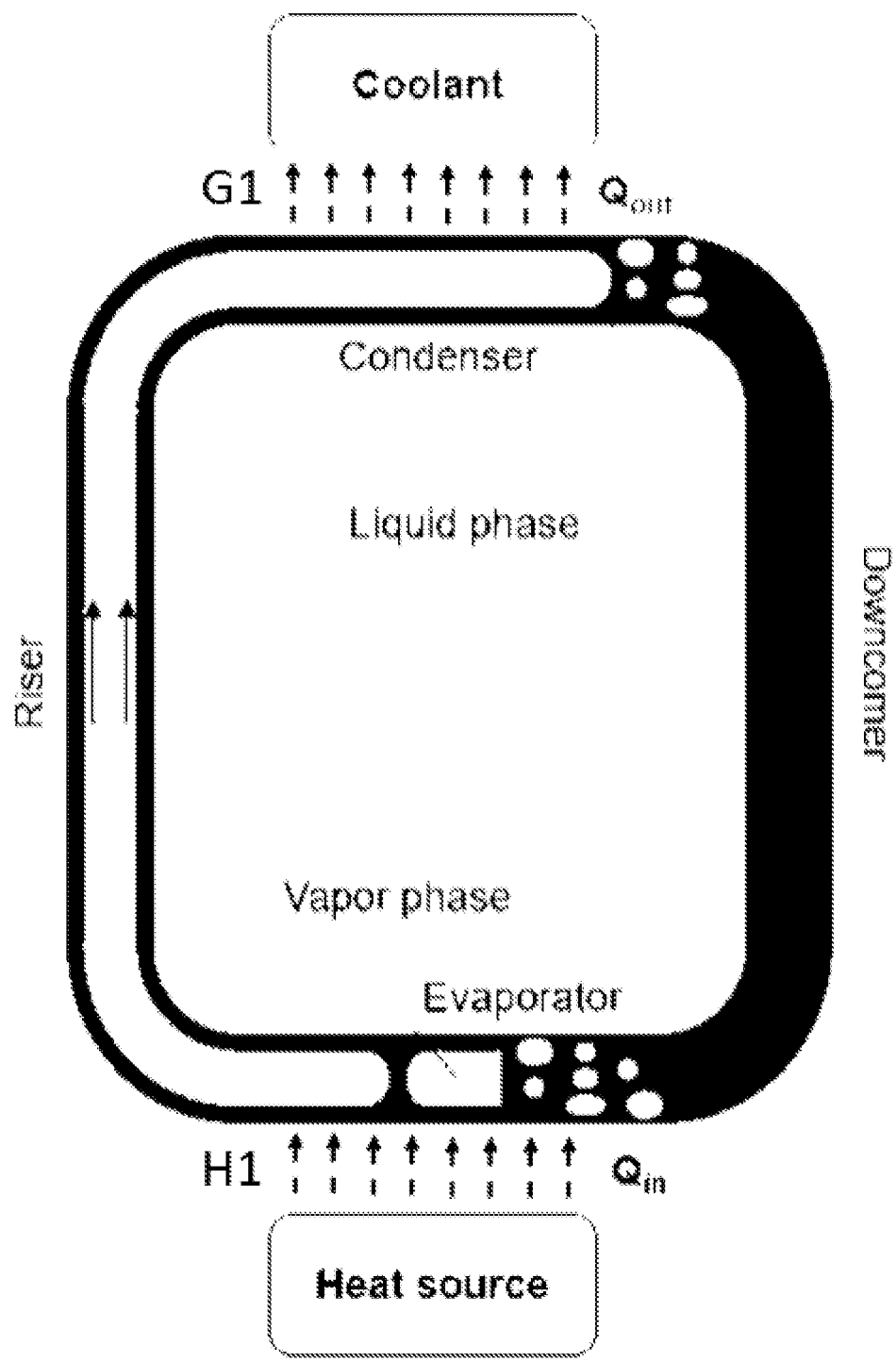
FIG. 1 shows a general prior art view schematic of a gravity-driven two-phase cooling system and its main components.
Figure 2:
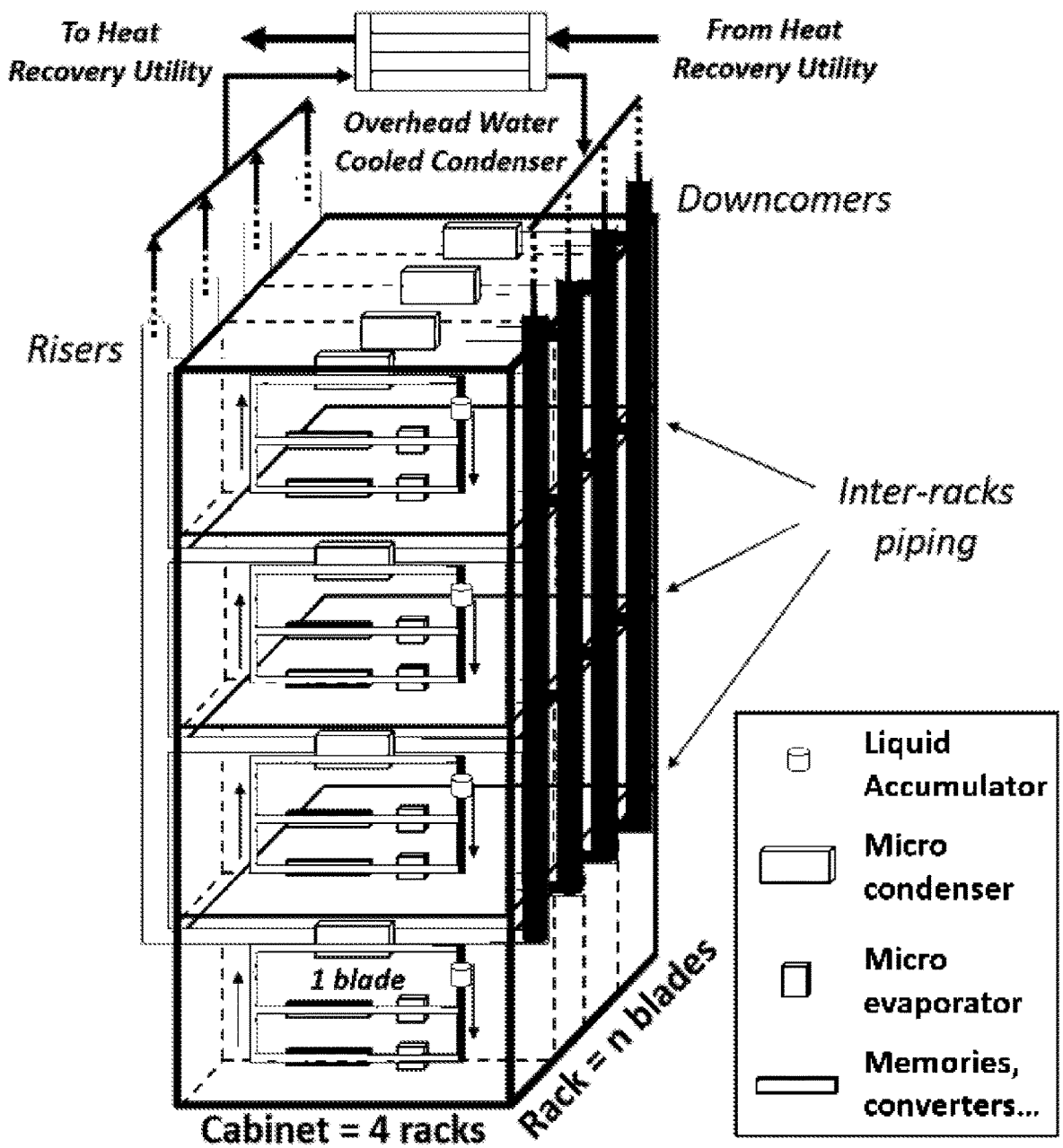
FIG. 2 shows a prior art concept of a two-phase cooling technology for next generation server racks.

Before explaining the disclosed embodiments of the present invention in detail it is to be understood that the invention is not limited in its applications to the details of the particular arrangements shown since the invention is capable of other embodiments. Also, the terminology used herein is for the purpose of description and not of limitation.

In the Summary above and in the Detailed Description of Preferred Embodiments and in the accompanying drawings, reference is made to particular features (including method steps) of the invention. It is to be understood that the disclosure of the invention in this specification does not include all possible combinations of such particular features. For example, where a particular feature is disclosed in the context of a particular aspect or embodiment of the invention, that feature can also be used, to the extent possible, in combination with and/or in the context of other particular aspects and embodiments of the invention, and in the invention generally.

In this section, some embodiments of the invention will be described more fully with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will convey the scope of the invention to those skilled in the art. Like numbers refer to like elements throughout, and prime notation is used to indicate similar elements in alternative embodiments.

Other technical advantages may become readily apparent to one of ordinary skill in the art after review of the following figures and description.

It should be understood at the outset that, although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described below.

Unless otherwise specifically noted, articles depicted in the drawings are not necessarily drawn to scale.

A list of acronyms and their definitions is referenced below.
    CPU Central Processing Unit
    CRAC Computer Room Air Conditioner
    CSA cross section area
    GPU Graphics Processing Unit
    ICT Information & Communication Technology
    PDU power distribution unit
    PDCU power distribution & collection unit
    TSL thermosyphon loop
    CSA cross-sectional area MEMS microelectromechanical systems
    RTD resistance temperature device
    IT envelope refers to any volume enclosing electronic or optoelectronic devices This invention disclosure summarizes a list of inventive features that enables the commercialization of an effective manifold for active and passive two-phase cooling systems.

Figure 3:
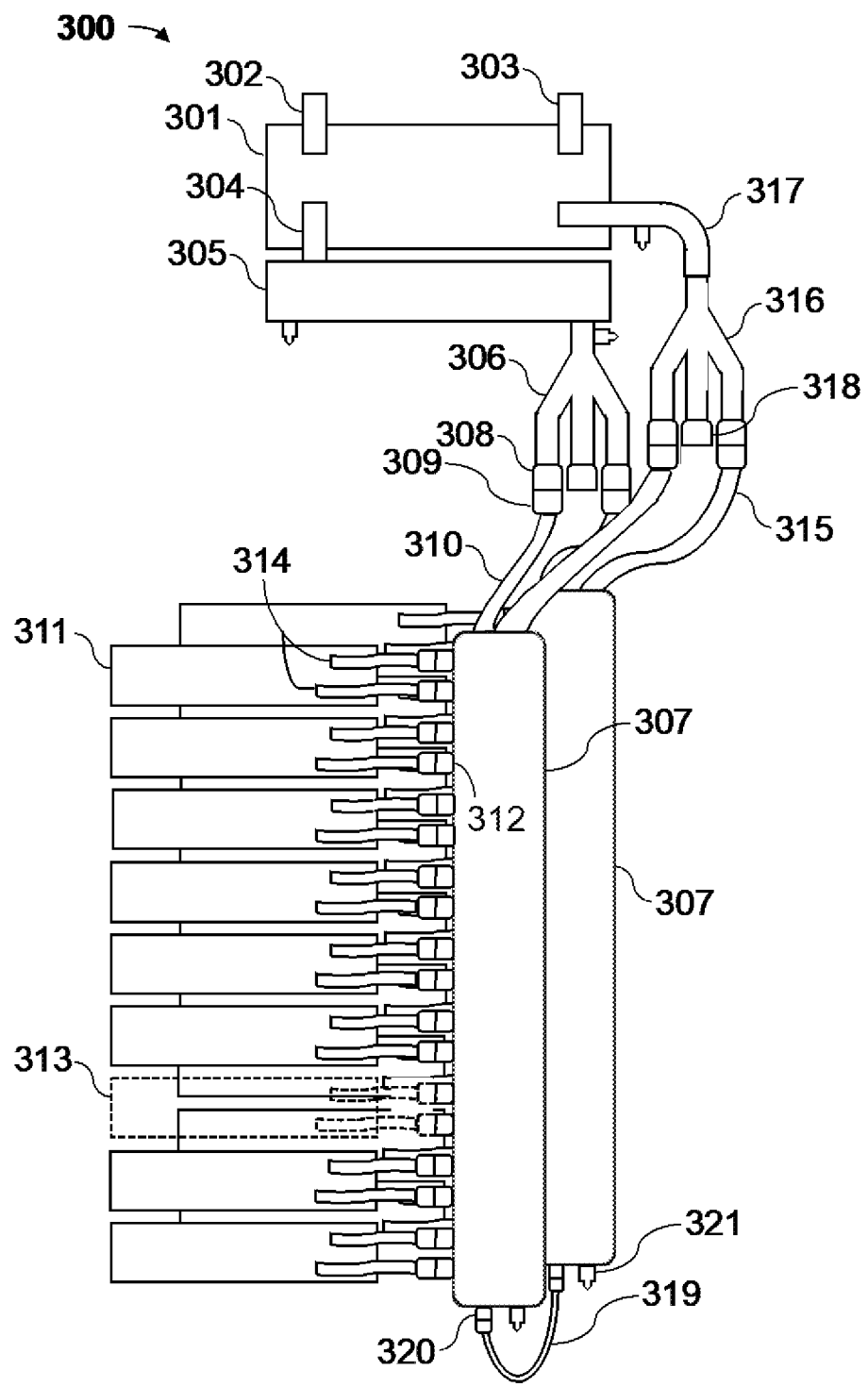
FIG. 3 shows a schematic of a two-phase cooling loop implementation with the proposed modular manifold for the subject invention.

FIG. 3 shows a schematic of an example two-phase system 300 implementation for cooling heat generating components. The system is configured to distribute coolant to multiple manifold units 307 which is advantageous for certain ICT architectures composed of pluggable sub-systems 311, i.e., servers, power distribution, blades, sleds, and the like, that do not span the entire width of a rack or chassis and are required to be readily serviceable. Each manifold unit 307 consists of one or more downcomer flow paths and one or more riser flow paths to enhance flow distribution, as will be shown below, and can be located on or around of the mechanical housing of the hardware components, e.g., server rack.

The number of manifold units, collectively risers and downcomers, can be optimized based on the number of pluggable sub-systems including server, network line cards, sleds, blades, optical pluggable modules and any other hardware equipment used in the ICT industry to be cooled in parallel in a rack, chassis, cabinet and any other mechanical housing used in the ICT industry. In addition, the system is redundantly configured to allow for manifold units 307 to be swapped out during system operation thus facilitating high availability for the ICT components. The features described here mitigate the challenges associated with maintain system availability and balancing flow distribution for effective hardware cooling.

The working fluid in such a system can be an ASHRAE-recognized refrigerant or other suitable coolant with properties that make it suitable for two-phase heat transfer. A system-level heat exchanger unit 301 is cooled by a supplied fluid 302 that is returned 303 to the facility with a higher enthalpy. Condensed working fluid, i.e., liquid, flows out of the heat exchanger from the downcomer port 304 into a reservoir 305, i.e., liquid accumulator. The liquid accumulator manages the system fluid inventory under dynamic power conditions and can be located on the downcomer line below the condenser or as an extension of the outlet header of the condenser. The accumulator manages the fluid inventory in the rack to ensure the presence of liquid in the downcomer of the manifold, maintain the design static head for flow loop operation and avoid condenser flooding at high heat loads.

Liquid exits the liquid accumulator into the downcomer branching junction 306 that can be positioned vertically, horizontally, or at some intermediate angle. The exit ports of the branching junction, e.g., wye-type tee, are configured such that the inlet flow and exit flows are substantially parallel to balance flow distribution under the action of gravity. The branching junction can have two or more exit ports depending on the number of vertical manifold units 307 to be connected in the system. At the end of each exit port on the branching junction there is an isolation valve 308, for example, a self-sealing quick coupler half. Another isolation valve 309, e.g., the self-sealing quick coupler mate of 308, is attached the manifold unit downcomer whip 310 which conveys liquid to the downcomer of the manifold unit 307 and can be rigid, semi-rigid or flexible.

The liquid coolant flow is distributed from the manifold unit 307 to a number of vertically distributed pluggable sub-systems 311 that can include, for example, 19" or 23" servers, network line cards, server sleds, server blades, optical pluggable modules or any other hardware equipment requiring thermal management used in the ICT (Information & Communication Technology) industry.

Two-phase cooling loops 314, which may be comprised of flexible, semi-flexible or rigid tubing or a combination of flexible, semi-flexible and rigid tubing, connected to one or more heat exchangers, i.e., evaporators, and which can be directly attached on or inside the pluggable sub-systems 311 to facilitate heat removal, are connected via one or more pairs of appropriately sized isolation valves 312, e.g., self-sealing quick couplings sized depending on the design coolant mass flow rate, and if the flow is single phase or two-phase, to the manifold unit 307 to facilitate the removal of a pluggable sub-system 313 for service or due to a fault in the pluggable sub-system cooling loop while the overall system is in operation.

Supplemental air-cooling can be provided to cool the low power hardware components at the pluggable sub-system-level that are not addressed with the two-phase cooling loop with this heat rejected to an additional air-to-liquid heat exchanger or directly to the facility housing the system.

The single- or two-phase flow from the pluggable sub-system to the manifold unit 307 flows into the riser of the manifold unit 307. The manifold unit riser whip 315, which can be rigid, semi-rigid or flexible, conveys the two-phase flow to the inlet of a riser branching junction 316 of a similar design, but not necessarily similar size, to that of the downcomer branching junction 306 via an isolation valve, e.g., a self-sealing quick coupler pair.

The riser branching junction 316 is located as close as practicably possible to the condenser inlet port 317 which in configured in size and shape to minimize pressure losses for the converged two-phase flow coming from one or more manifold units 307. The downcomer and riser branching junctions can be provisioned with at least one additional redundant port with an isolation valve 318 with respect to the design number of manifold units 307 to be deployed. This feature facilitates, for example, the addition of a further manifold unit into the system or the replacement of a manifold unit due to a capacity upgrade or in response to a manifold unit failure during operation.

The operation of the two-phase cooling system is further enhanced by a feature that connects two or more manifold units together fluidically at the bottommost elevation of the manifold units. This can be achieved, for example, by connecting a tube 319 at the bottom of a manifold unit downcomer to another manifold unit downcomer via isolation valves 320, e.g., self-sealing quick couplings.

For system implementations involving more than two manifold units, several isolation valve bodies on a multi-way tee can be provided for.

This arrangement has several advantages. It mitigates maldistribution of working fluid to the downcomers by leveraging on the liquid head difference between downcomer splits to drive a rebalancing flow. This situation may arise, for example, due to time varying operational heat loads delivered into the cooling system from the heat generating components, due to the removal of one or more pluggable sub-systems, during a system shutdown followed by a start-up or during system charging.

Additionally, this feature in addition to the redundant port on the riser/downcomer branching junctions can facilitate the swap out of a manifold unit while the overall system is in operation in the event of an upgrade to or due to a failure in a manifold unit by aiding in the management of the fluid inventory split between manifold units.

Additionally, the manifold units, accumulator, condenser, and branching junctions can be provisioned with access ports 321 to be able to vacuum, charge, perform pressure tests and generally access different portions of the overall system during operation or for service. Manifold unit variations can include their location on and around the server/chassis rack.

Design Implementation of the Manifold Units and Supporting System Components

Here we provide a description of manifold unit features that can be implemented to promote good flow distribution in a two-phase flow system under the action of gravity and additional system features that provide sensing and thermal control of the overall two-phase cooling system. The general design approach is represented in FIG. 4, which depicts the progressive reduction in characteristic flow dimensions of the manifold unit with distance from the elevated condenser in the presence of a gravitational field described by the vector 401. The requirement for such a design philosophy arises from the presence of a static pressure gradient that develops along the manifold unit in the presence of gravity due to a liquid flow on the downcomer and a lower density two-phase flow on the riser which must be managed to adequately distribute flow to the pluggable sub-systems 311. Embodiments are described in the figures/figure captions below.

FIG. 5 shows a schematic cross section of an example manifold unit 500 with a downcomer liquid flow 501 and a riser flow 502 where the characteristic flow dimensions in the manifold unit decrease with decreasing elevation to manage changes in the static pressure of the liquid column in the downcomer and decreasing flowrate in the riser. The sizing of the downcomer is smaller relative to the riser due to the differing frictional pressure drop gradient between single-phase and two-phase flow. Continuous or step variation, in steps of two, three, four or more, of the flow dimensions 503 along the length of the manifold unit downcomer flow conduit optimizes the flow momentum and friction trade-off to improve flow distribution to the vertically distributed ports (not shown). Continuous or step variation, in steps of two, three, four or more, of the flow dimensions 504 along the length of the manifold unit riser flow conduit optimizes the flow velocity. The riser dimensions are maximized to minimize pressure drop but limited considering the requirement to keep the two-phase flow velocity suitably high to avoid phase separation of the liquid and vapor in the gravitational field 505.

An insulating air-gap feature 506 located between the riser and downcomer near the upper portion of the manifold unit manages the variation in downcomer liquid flow subcooling associated with sensible heating and the static pressure of the liquid column in the downcomer.

FIG. 6 shows a schematic cross-section of the manifold unit 600 with flow configured with respect to gravity as in FIG. 5 showing a progressive reduction in the downcomer port 601 dimensions that manages flow distribution due to the increasing static head of the liquid in the downcomer. The riser ports dimensions are kept substantially the same to minimize the larger pressure drop associated with two-phase flow.

FIG. 7 shows a schematic cross-section of manifold unit 700 with flow configured with respect to gravity as in FIG. 5 showing restrictions 701 located in the downcomer flow conduit of the manifold unit that manages flow distribution due to the increasing static head of the liquid in the downcomer. These restrictions can be, for example, simple orifices, Venturis or pressure-differential activated flow restrictors.

FIG. 8A shows a schematic cross-section of a manifold unit 800 with flow configured with respect to gravity as in FIG. 5 showing a primary downcomer 801 (riser not shown), a by-pass downcomer 802 and the fluidic connectivity between the primary and by-pass downcomers along the manifold unit 803 and at the bottom of the manifold unit 804 to allow flow from the by-pass downcomer to the primary downcomer to facilitate improved flow distribution to the downcomer ports 808. Liquid coolant is distributed to the primary and by-pass downcomers, which may have cross-sectional flow dimensions that are the same or substantially different, via a branching junction 805, e.g., wye-type tee, configured such that the inlet flow and exit flows are substantially parallel to balance flow distribution under the action of gravity.

The downcomer port inlets 806 can be rounded or structured in such a way to reduce turning losses as flow moves into the ports configured orthogonal to the manifold unit downcomer flow to facilitate alignment between the manifold unit 307 and the pluggable sub-systems 311 when deployed in the two-phase cooling system 300. This feature can also be implemented in the ports of the riser of the manifold unit to reduce pressure losses. Additional restrictions 807 can be integrated at each port of the primary downcomer of the manifold unit with pressure drop characteristics suitable to manage the flow distribution due to the liquid static head variation along the downcomer and may also be included in the primary downcomer flow conduit and the by-pass downcomer flow conduit. These restrictions can be, for example, simple orifices, Venturis or pressure-differential activated flow restrictors.

FIG. 8B shows a cross-section schematic of a manifold in FIG. 8A showing a possible arrangement of the riser 809, primary downcomer 801 and by-pass downcomer 802 with respect to a downcomer port and a riser port that distributed flow to and from a pluggable sub-system 311, respectively.

FIG. 9A shows a configuration 900 of the cooling system manifold unit 901 (shown as cross-section schematic, view B-B' in FIG. 9B) showing the riser 902 and downcomer 903 disposed in an offset fashion to minimize the width of the manifold unit when mounted on a rail 904 to facilitate the placement of additional coolant or power distribution components or cable management 905 while still facilitating flow to 906 and from 907 a pluggable sub-system 908 via the downcomer 909 and riser ports 910.

FIG. 9B shows a cross-section schematic (A-A' view in FIG. 9A) of a manifold unit 901 showing unequally-sized, vertically offset riser 910 and downcomer 909 ports to facilitate the compact width of the manifold unit 901 for the example deployment shown in 900.

Modular Manifold

As shown as a cross-section schematic in FIG. 10, the implementation of the manifold unit can be further optimized by adopting a modular design 1000. This provides flexibility to mix and match two or more manifold unit sections, for example, three manifold unit sections 1001, 1002, 1003 with different riser 1004 and downcomer 1005 flow geometry parameters based on the design distribution of heat sources and the total size of a system to be cooled.

The modular manifold can implement a compact mechanical joint between sections that may be secured with clamps disposed on 1006 or recessed into 1007 the manifold unit sections aligned with guide pins and/or mechanical fasteners 1008 incorporated into a clamp plate to secure the manifold unit sections together and reinforced with high strength pins 1009 that span the joint. To isolate fluidically the riser and downcomer sections from each other and the ambient environment, O-ring seals or gasket seals or any suitable sealing method can be disposed at the joint.

Refrigerant Leak Detection

Minor refrigerant leak over long-time scale could become a significant burden to maintain the system at an optimal condition, while major leak could lead to catastrophic accidents (i.e., low liquid level in the system would lead to refrigerant dry-out in the evaporator with large temperature fluctuations of the hardware components over time). To detect minor vapor leaks, vapor sensor modules, such as infrared-based, electrochemical based, MEMS-based, or photodiode-based sensors could be installed on strategic locations around the manifold for real-time continuous anomaly detection.

For gross leak detection, low-cost temperature probes (e.g., thermocouple, thermistor, RTD, etc.) can be strategically positioned around the system at potential risk to mechanical failure, and therefore most probably refrigerant leak points. In case of gross refrigerant leaks, rapid temperature drop due to evaporative cooling effect via latent heat during refrigerant evaporation can be used as a proxy to quickly identify accidents and respond by safely turning off IT equipment.

FIG. 11 shows a schematic of a network of temperature sensor-based leak detection disposed on and around a manifold unit with probes 1101 located at potential leak points in the system such as the at the downcomer and riser ports 1102 and at the joint between manifold unit sections in a modular manifold unit deployment 1103.

Manifold Starter/Control Heater

Resistive heating elements (localized or distributed) located on the manifold unit riser(s) can provide precise amounts of heat into the two-phase loop during the system operation and during the system start-up procedure (FIG. 12).

The power delivery to the heaters is controlled by the external controller unit using, for example solid state relays packaged into the control unit and powered by AC or DC power delivered from, for example, the rack PDU. During start-up, the heat input to the riser(s) will initiate a stable recirculation of two-phase refrigerant mixture within the thermosyphon loop, while avoiding uncontrolled and unstable flow patterns in the presence of the uncontrolled heat source, e.g., pluggable sub-systems.

Once the control system, detects robust two-phase flow and the servers are operating, the heater turns off automatically to improve energy efficiency of the system. A specific example of an implementation is shown in FIG. 12. This feature also allows for loop maintenance by carefully controlling the loop flow rate to operate an optimal degassing cycle via an automatic degassing valve before the overall IT system enters into operation.

FIG. 12 shows a schematic of a specific implementation of the invention where the control heaters are attached on the bottom of the manifold risers below the level of the bottommost server working fluid connections.

FIG. 13 shows a schematic of a specific implementation of the invention where the control heaters are attached on the bottom of the manifold risers below the level of the bottommost server working fluid connections. The use of a local air gap between the heated riser portion and the downcomer and insulation around the manifold can maximize the amount of heat transferred into the riser.

The term "approximately"/"approximate" can be +/−10% of the amount referenced. Additionally, preferred amounts and ranges can include the amounts and ranges referenced without the prefix of being approximately.

Although specific advantages have been enumerated above, various embodiments may include some, none, or all of the enumerated advantages.

Modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

To aid the Patent Office and any readers of any patent issued on this application in interpreting the claims appended hereto, applicants wish to note that they do not intend any of the appended claims or claim elements to invoke 35 U.S.C. 112(f) unless the words "means for" or "step for" are explicitly used in the particular claim.

While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

The invention claimed is:

1. A fluid flow manifold system for cooling a plurality of pluggable sub-systems selected from at least servers, network line cards, server sleds, server blades, optical pluggable modules, and other hardware equipment requiring thermal management used in the ICT (Information & Communication Technology) industry, comprising:
   an overhead condenser that exchanges heat outside of the system with a flow line connection to an accumulator which manages fluid in a rack:
   manifold units fluidly connected to the accumulator and the condenser, which include:
   riser flow conduits and riser ports that convey two-phase fluid from the plurality of pluggable sub-systems to the condenser,
   downcomer flow conduits and downcomer ports which convey single-phase fluid to the plurality of pluggable sub-systems: and
   sloped branch junction connectors, wherein the manifold system distributes fluid flow due at an elevated pressure source to the manifold units that supply multiple evaporators in the plurality of pluggable sub-systems in the system, and the plurality of pluggable sub-systems are cooled in parallel, wherein the elevated pressure source is formed from gravity or a pump;
   flow line connection between two or more downcomer lines at a lowest elevation of the system to balance downcomer liquid level; and
   server by-pass flow line with restricted flow CSA (cross section area) between a downcomer and a riser at the lowest elevation of the system.

2. The manifold system of claim 1, wherein the manifold units are fluidically connected to the accumulator and the condenser via sloped branch junctions to balance flow distribution via gravity on a downcomer side of the manifold system.

3. The manifold system of claim 2, further comprising:
   a minimal length between a condenser refrigerant inlet and the sloped branch junctions on a riser side to reduce pressure drop as two-phase flow returns to the condenser.

4. The manifold system of claim 2, further comprising: redundant ports with isolation valves on the sloped branch junctions connecting to the downcomer and riser flow conduits in the manifold units to facilitate replacement of the manifold units during system operation.

5. The manifold system of claim 4, further comprising: progressive variation of flow tube CSA (cross section area) along a length of the riser and the downcomer.

6. The manifold system of claim 1, further comprising: coolant sensor modules installed on selected locations on the manifold system to detect leaks to provide real-time continuous anomaly detection.

7. The manifold system of claim 6, wherein the coolant sensor modules are selected from at least one of: infrared-based sensors, electrochemical based sensors, MEMS (microelectromechanical systems) based sensors, and photodiode-based sensors.

8. A fluid flow manifold system for cooling a plurality of pluggable sub-systems selected from at least servers, network line cards, server sleds, server blades, optical pluggable modules, and other hardware equipment requiring thermal management used in the ICT (Information & Communication Technology) industry, comprising:
- an overhead condenser that exchanges heat outside of the system with a flow line connection to an accumulator which manages fluid in a rack;
- manifold units fluidly connected to the accumulator and the condenser, which include:
- riser flow conduits and riser ports that convey two-phase fluid from the plurality of pluggable sub-systems to the condenser,
- downcomer flow conduits and downcomer ports which convey single-phase fluid to the plurality of pluggable sub-systems: and
- sloped branch junction connectors, wherein the manifold system distributes fluid flow due at an elevated pressure source to the manifold units that supply multiple evaporators in the plurality of pluggable sub-systems in the system, and the plurality of pluggable sub-systems are cooled in parallel, wherein the elevated pressure source is formed from gravity or a pump; and
- material selectively removed between a riser and downcomer manifold to achieve controlled heat conduction between the riser and downcomer manifold, while retaining structural integrity of the manifold system.

9. A fluid flow manifold system for cooling a plurality of pluggable sub-systems selected from at least servers, network line cards, server sleds, server blades, optical pluggable modules, and other hardware equipment requiring thermal management used in the ICT (Information & Communication Technology) industry, comprising:
- an overhead condenser that exchanges heat outside of the system with a flow line connection to an accumulator which manages fluid in a rack;
- manifold units fluidly connected to the accumulator and the condenser, which include:
- riser flow conduits and riser ports that convey two-phase fluid from the plurality of pluggable sub-systems to the condenser,
- downcomer flow conduits and downcomer ports which convey single-phase fluid to the plurality of pluggable sub-systems: and
- sloped branch junction connectors, wherein the manifold system distributes fluid flow due at an elevated pressure source to the manifold units that supply multiple evaporators in the plurality of pluggable sub-systems in the system, and the plurality of pluggable sub-systems are cooled in parallel, wherein the elevated pressure source is formed from gravity or a pump; and
- flow restrictors inserted into the downcomer flow conduits and the downcomer ports of the manifold units to manage excess static pressure developed in the downcomer.

10. A fluid flow manifold system for cooling a plurality of pluggable sub-systems selected from at least servers, network line cards, server sleds, server blades, optical pluggable modules, and other hardware equipment requiring thermal management used in the ICT (Information & Communication Technology) industry, comprising:
- an overhead condenser that exchanges heat outside of the system with a flow line connection to an accumulator which manages fluid in a rack;
- manifold units fluidly connected to the accumulator and the condenser, which include:
- riser flow conduits and riser ports that convey two-phase fluid from the plurality of pluggable sub-systems to the condenser,
- downcomer flow conduits and downcomer ports which convey single-phase fluid to the plurality of pluggable sub-systems: and
- sloped branch junction connectors, wherein the manifold system distributes fluid flow due at an elevated pressure source to the manifold units that supply multiple evaporators in the plurality of pluggable sub-systems in the system, and the plurality of pluggable sub-systems are cooled in parallel, wherein the elevated pressure source is formed from gravity or a pump; and
- smooth flow transition incorporated into the manifold units on entrances to the downcomer ports to guide passive fluid flow and on entrances to the riser ports to minimize pressure drop while maintaining riser and downcomer port alignment to pluggable sub-systems.

11. A fluid flow manifold system for cooling a plurality of pluggable sub-systems selected from at least servers, network line cards, server sleds, server blades, optical pluggable modules, and other hardware equipment requiring thermal management used in the ICT (Information & Communication Technology) industry, comprising:
- an overhead condenser that exchanges heat outside of the system with a flow line connection to an accumulator which manages fluid in a rack;
- manifold units fluidly connected to the accumulator and the condenser, which include:
- riser flow conduits and riser ports that convey two-phase fluid from the plurality of pluggable sub-systems to the condenser,
- downcomer flow conduits and downcomer ports which convey single-phase fluid to the plurality of pluggable sub-systems: and
- sloped branch junction connectors, wherein the manifold system distributes fluid flow due at an elevated pressure source to the manifold units that supply multiple evaporators in the plurality of pluggable sub-systems in the system, and the plurality of pluggable sub-systems are cooled in parallel, wherein the elevated pressure source is formed from gravity or a pump; and
- offset riser and downcomer flow conduits to optimize space occupied by the manifold units with ports sized substantially different to further manage space and minimize pressure drop.

12. A fluid flow manifold system for cooling a plurality of pluggable sub-systems selected from at least servers, network line cards, server sleds, server blades, optical pluggable modules, and other hardware equipment requiring thermal management used in the ICT (Information & Communication Technology) industry, comprising:
- an overhead condenser that exchanges heat outside of the system with a flow line connection to an accumulator which manages fluid in a rack;
- manifold units fluidly connected to the accumulator and the condenser, which include:
- riser flow conduits and riser ports that convey two-phase fluid from the plurality of pluggable sub-systems to the condenser, downcomer flow conduits and downcomer ports which convey single-phase fluid to the plurality of pluggable sub-systems: and sloped branch junction connectors, wherein the manifold system distributes fluid flow due at an elevated pressure source to the manifold units that supply multiple evaporators in the plurality of pluggable sub-systems in the system, and the plurality of pluggable sub-systems are cooled in parallel, wherein the elevated pressure source is formed from gravity or a pump; and a by-pass downcomer flow conduit to aid in the effective distribution of a coolant.

13. A fluid flow manifold system for cooling a plurality of pluggable sub-systems selected from at least servers, network line cards, server sleds, server blades, optical pluggable modules, and other hardware equipment requiring thermal management used in the ICT (Information & Communication Technology) industry, comprising:

an overhead condenser that exchanges heat outside of the system with a flow line connection to an accumulator which manages fluid in a rack;

manifold units fluidly connected to the accumulator and the condenser, which include:

riser flow conduits and riser ports that convey two-phase fluid from the plurality of pluggable sub-systems to the condenser, downcomer flow conduits and downcomer ports which convey single-phase fluid to the plurality of pluggable sub-systems; and sloped branch junction connectors, wherein the manifold system distributes fluid flow due at an elevated pressure source to the manifold units that supply multiple evaporators in the plurality of pluggable sub-systems in the system, and the plurality of pluggable sub-systems are cooled in parallel, wherein the elevated pressure source is formed from gravity or a pump; and temperature probes strategically positioned around the system for coolant gross leak detection based on anomalous temperature variations, wherein the temperature probes are selected from at least one of: a thermocouple, thermistor, a RTD (resistance temperature device), and diode and are strategically positioned around the system at points of risk to mechanical failure, and therefore most probable refrigerant leak points.

14. A fluid flow manifold system for cooling a plurality of pluggable sub-systems selected from at least servers, network line cards, server sleds, server blades, optical pluggable modules, and other hardware equipment requiring thermal management used in the ICT (Information & Communication Technology) industry, comprising:

an overhead condenser that exchanges heat outside of the system with a flow line connection to an accumulator which manages fluid in a rack;

manifold units fluidly connected to the accumulator and the condenser, which include:

riser flow conduits and riser ports that convey two-phase fluid from the plurality of pluggable sub-systems to the condenser, downcomer flow conduits and downcomer ports which convey single-phase fluid to the plurality of pluggable sub-systems: and sloped branch junction connectors, wherein the manifold system distributes fluid flow due at an elevated pressure source to the manifold units that supply multiple evaporators in the plurality of pluggable sub-systems in the system, and the plurality of pluggable sub-systems are cooled in parallel, wherein the elevated pressure source is formed from gravity or a pump; and resistive heating elements on manifold risers to provide precise amounts of heat into a cooling loop for start-up control and during system operation.

15. The manifold system of claim 14, wherein the resistive heating elements provide localized or distributed heat input into the cooling loop.

* * * * *